United States Patent
Ogawa et al.

(10) Patent No.: US 10,132,694 B2
(45) Date of Patent: Nov. 20, 2018

(54) METHOD OF ESTIMATING HEAT DISTRIBUTION OF IMAGE DISPLAY UNIT, DEVICE FOR ESTIMATING HEAT DISTRIBUTION OF IMAGE DISPLAY UNIT, IMAGE DISPLAY DEVICE, ELECTRONIC APPARATUS INCLUDING IMAGE DISPLAY DEVICE, AND PROGRAM FOR PERFORMING METHOD OF ESTIMATING HEAT DISTRIBUTION OF IMAGE DISPLAY UNIT

(71) Applicant: Sony Corporation, Tokyo (JP)

(72) Inventors: Ryo Ogawa, Kanagawa (JP); Atsushi Ito, Kanagawa (JP)

(73) Assignee: Sony Corporation, Tokyo (JP)

( * ) Notice: Subject to any disclaimer, the term of this patent is extended or adjusted under 35 U.S.C. 154(b) by 547 days.

(21) Appl. No.: 14/638,539

(22) Filed: Mar. 4, 2015

(65) Prior Publication Data
US 2015/0268100 A1    Sep. 24, 2015

(30) Foreign Application Priority Data

Mar. 24, 2014  (JP) ................. 2014-060163

(51) Int. Cl.
*G01J 5/28* (2006.01)
*G01K 3/14* (2006.01)
*G01K 13/00* (2006.01)
*H01L 51/00* (2006.01)
*G01J 5/30* (2006.01)

(52) U.S. Cl.
CPC ............ *G01K 3/14* (2013.01); *G01J 5/28* (2013.01); *G01J 5/30* (2013.01); *G01K 13/00* (2013.01); *H01L 51/0031* (2013.01)

(58) Field of Classification Search
CPC ............ G01J 5/0066; G01J 2005/106; G01J 2005/202; G01J 2005/283; G01J 2005/286; G01J 5/30; G01J 5/48; H01L 2251/50; H01L 2251/53; H01L 2251/556
See application file for complete search history.

(56) References Cited

U.S. PATENT DOCUMENTS

2008/0284702 A1* 11/2008 Shidara ................ G09G 3/20
345/90

FOREIGN PATENT DOCUMENTS

JP    2011-203314    10/2011

* cited by examiner

*Primary Examiner* — Cheung Lee
(74) *Attorney, Agent, or Firm* — Michael Best & Friedrich LLP

(57) ABSTRACT

A method of estimating heat distribution of an image display unit includes: calculating, based on image data, an average current value of a pixel area in a display surface, the pixel area including at least one pixel in an image display unit, the image display unit including pixels arranged therein; calculating heat generation amount data by multiplying the calculated average current value by a predetermined current-heat conversion coefficient to convert the calculated average current value into a value corresponding to an amount of heat generation; and adding the heat generation amount data to a value of a first heat distribution table to update the first heat distribution table, and creating a new first heat distribution table by performing a two-dimensional low pass filter process on the updated table before multiplying a value of the processed table by a predetermined heat dissipation coefficient, at every predetermined period.

20 Claims, 10 Drawing Sheets

FIG.9A
FIG.9B
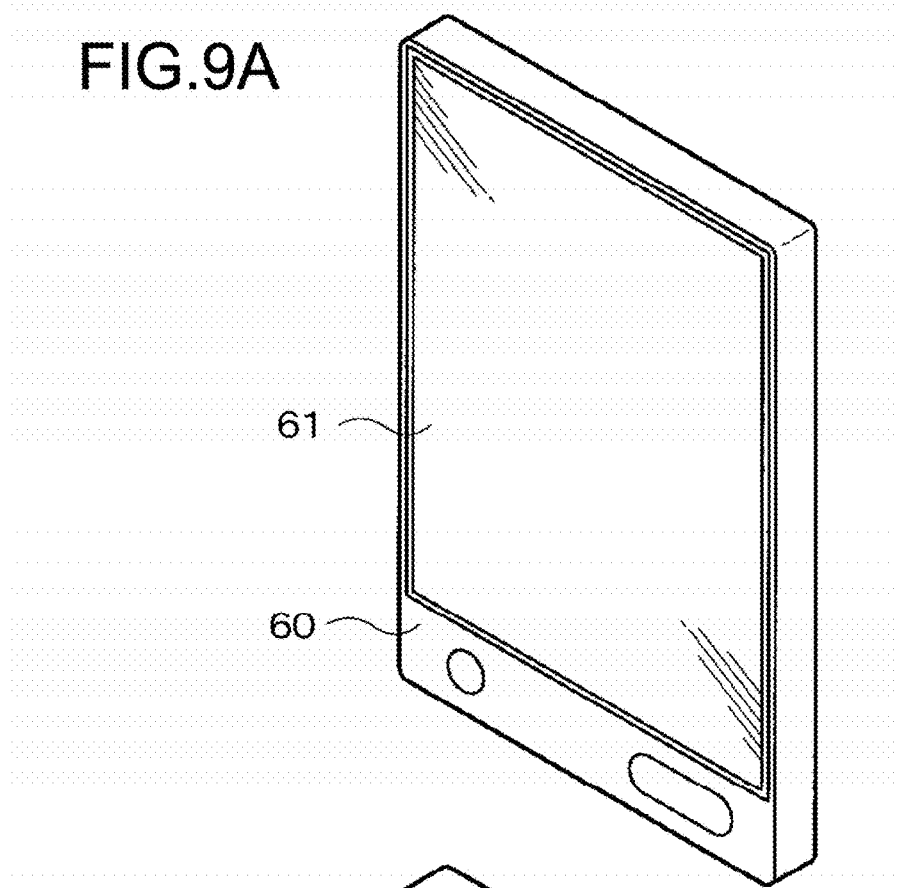
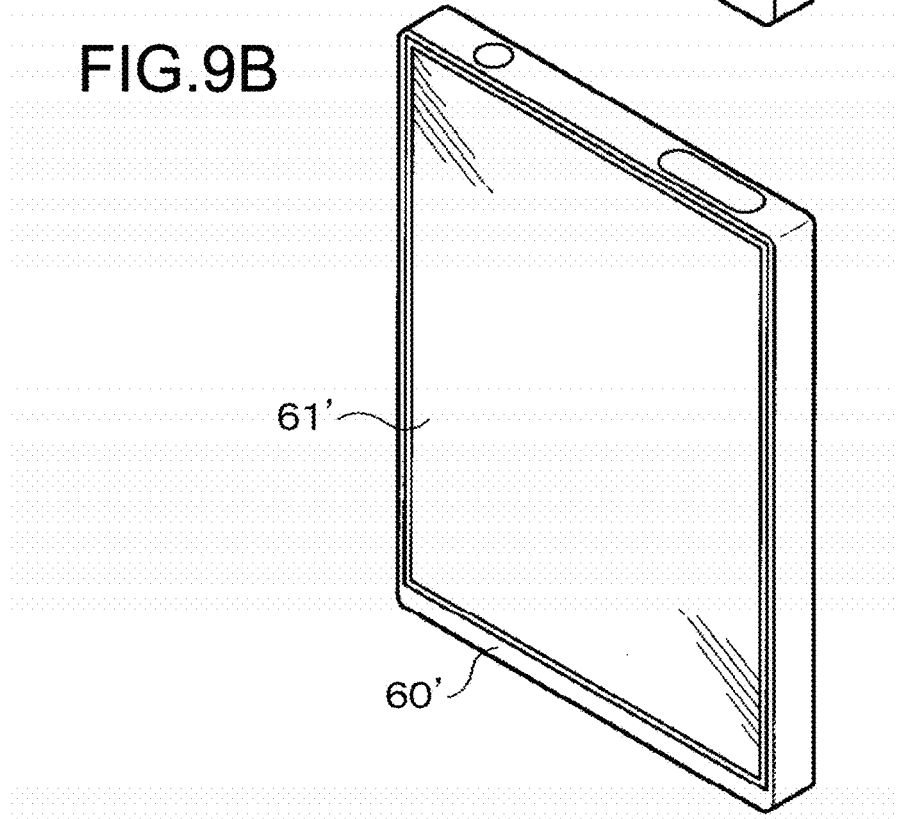

_US 10,132,694 B2_

METHOD OF ESTIMATING HEAT DISTRIBUTION OF IMAGE DISPLAY UNIT, DEVICE FOR ESTIMATING HEAT DISTRIBUTION OF IMAGE DISPLAY UNIT, IMAGE DISPLAY DEVICE, ELECTRONIC APPARATUS INCLUDING IMAGE DISPLAY DEVICE, AND PROGRAM FOR PERFORMING METHOD OF ESTIMATING HEAT DISTRIBUTION OF IMAGE DISPLAY UNIT

CROSS REFERENCE TO RELATED APPLICATIONS

This application claims the benefit of Japanese Priority Patent Application JP 2014-060163 filed Mar. 24, 2014, the entire contents of which are incorporated herein by reference.

BACKGROUND

The present disclosure relates to a method of estimating heat distribution of an image display unit, a device for estimating heat distribution of an image display unit suitable for performing the method of estimating heat distribution of an image display unit, an image display device including the device for estimating heat distribution of an image display unit, an electronic apparatus including the image display device, and a program for performing the method of estimating heat distribution of an image display unit.

In recent years, a liquid crystal display apparatus or an organic electroluminescence display apparatus draws increasing attention as a flat panel display apparatus. The organic electroluminescence display apparatus (hereinafter, abbreviated simply as "organic EL display apparatus" in some cases) is a self-light emitting apparatus, and has advantages over the liquid crystal display apparatus in that the organic EL display apparatus is suitable for thickness reduction or increase in brightness.

Incidentally, in some cases, the characteristics and brightness of an organic electroluminescence element (hereinafter, abbreviated simply as "organic EL element" in some cases) constituting each pixel of the organic EL display apparatus vary depending on the operational state.

For example, the organic EL element that is in an area for performing bright image display has a large amount of heat generation and a large amount of light emission, and thus is easy to degrade. In the case where the organic EL display apparatus is used as the image display unit of a television receiver, receiving channel information, time, various types of data including character data, and the like, can be continuously displayed at the corner portion or lower portion of the image display unit. In such a state, so-called "screen burn-in" is visible at the portion.

As a countermeasure, a possible method includes acquiring information on the heat distribution of the image display unit to correct the brightness or the like based on the acquired information. For example, Japanese Patent Application Laid-open No. 2011-203314 discloses that information on temperature distribution of the image display unit including a plurality of pixels arranged therein or the like is estimated based on image data.

SUMMARY

The temperature of the image display unit varies depending on the heat generated with the operation of the pixel, or heat dissipation caused due to heat conduction or the like. However, in Japanese Patent Application Laid-open No. 2011-203314, elements such as heat dissipation are not taken into account. Furthermore, the influence of heat dissipation of a power source circuit or a signal processing circuit arranged on the back surface of the image display unit, for example, is also not taken into account. Therefore, a difference occurs between the estimated heat distribution and the actual heat distribution in some cases.

Therefore, it is desirable to provide a method of estimating heat distribution of an image display unit having improved accuracy, a device for estimating heat distribution of an image display unit suitable for performing the method of estimating heat distribution of an image display unit, an image display device including the device for estimating heat distribution of an image display unit, an electronic apparatus including the image display device, and a program for performing the method of estimating heat distribution of an image display unit.

According to a first embodiment of the present disclosure, there is provided a method of estimating heat distribution of an image display unit including calculating, based on image data, an average current value of a pixel area in a display surface, the pixel area including at least one pixel in an image display unit, the image display unit including a plurality of pixels arranged therein, calculating heat generation amount data by multiplying the calculated average current value by a predetermined current-heat conversion coefficient to convert the calculated average current value into a value corresponding to an amount of heat generation, and adding the heat generation amount data to a value of a first heat distribution table to update the first heat distribution table, and creating a new first heat distribution table by performing a two-dimensional low pass filter process on the updated first heat distribution table before multiplying a value of the processed first heat distribution table by a predetermined heat dissipation coefficient, at every predetermined period.

According to a first embodiment of the present disclosure, there is provided a device for estimating heat distribution of an image display unit that estimates heat distribution of an image display unit including a plurality of pixels arranged therein, which is configured to calculate, based on image data, an average current value of a pixel area in a display surface, the pixel area including at least one pixel in an image display unit, the image display unit including a plurality of pixels arranged therein, to calculate heat generation amount data by multiplying the calculated average current value by a predetermined current-heat conversion coefficient to convert the calculated average current value into a value corresponding to an amount of heat generation, and to add the heat generation amount data to a value of a first heat distribution table to update the first heat distribution table, and creating a new first heat distribution table by performing a two-dimensional low pass filter process on the updated first heat distribution table before multiplying a value of the processed first heat distribution table by a predetermined heat dissipation coefficient, at every predetermined period.

According to a first embodiment of the present disclosure, there is provided an image display device including a device for estimating heat distribution of an image display unit that estimates heat distribution of an image display unit including a plurality of pixels arranged therein, the device for estimating heat distribution of an image display unit being configured to calculate, based on image data, an average current value of a pixel area in a display surface, the pixel area including at least one pixel in an image display unit, the image display unit including a plurality of pixels arranged therein, to calculate heat generation amount data by multiplying the calculated average current value by a predetermined current-heat conversion coefficient to convert the calculated average current value into a value corresponding to an amount of heat generation, and to add the heat generation amount data to a value of a first heat distribution table to update the first heat distribution table, and creating a new first heat distribution table by performing a two-dimensional low pass filter process on the updated first heat distribution table before multiplying a value of the processed first heat distribution table by a predetermined heat dissipation coefficient, at every predetermined period.

According to a first embodiment of the present disclosure, there is provided an electronic apparatus including an image display device including a device for estimating heat distribution of an image display unit that estimates heat distribution of an image display unit including a plurality of pixels arranged therein, the device for estimating heat distribution of an image display unit being configured to calculate, based on image data, an average current value of a pixel area in a display surface, the pixel area including at least one pixel in an image display unit, the image display unit including a plurality of pixels arranged therein, to calculate heat generation amount data by multiplying the calculated average current value by a predetermined current-heat conversion coefficient to convert the calculated average current value into a value corresponding to an amount of heat generation, and to add the heat generation amount data to a value of a first heat distribution table to update the first heat distribution table, and creating a new first heat distribution table by performing a two-dimensional low pass filter process on the updated first heat distribution table before multiplying a value of the processed first heat distribution table by a predetermined heat dissipation coefficient, at every predetermined period.

According to a first embodiment of the present disclosure, there is provided a program that causes a computer to execute the steps of calculating, based on image data, an average current value of a pixel area in a display surface, the pixel area including at least one pixel in an image display unit, the image display unit including a plurality of pixels arranged therein, calculating heat generation amount data by multiplying the calculated average current value by a predetermined current-heat conversion coefficient to convert the calculated average current value into a value corresponding to an amount of heat generation, and adding the heat generation amount data to a value of a first heat distribution table to update the first heat distribution table, and creating a new first heat distribution table by performing a two-dimensional low pass filter process on the updated first heat distribution table before multiplying a value of the processed first heat distribution table by a predetermined heat dissipation coefficient, at every predetermined period.

According to the present disclosure, it is possible to improve the accuracy of estimating heat distribution because elements such as heat dissipation are taken into account when heat distribution is estimated. In addition, it is possible to estimate, with improved accuracy, the heat distribution of the image display unit because the influence of heat dissipation of a power source circuit or a signal processing circuit arranged on the back surface of the image display unit, for example, can also be taken into account.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 9A is a perspective view showing the appearance of an application example 1 of a display apparatus according to the Embodiment;

FIG. 9B is a perspective view showing the appearance of the application example 1 of the display apparatus according to the Embodiment.

DETAILED DESCRIPTION OF EMBODIMENTS

Figure 1:
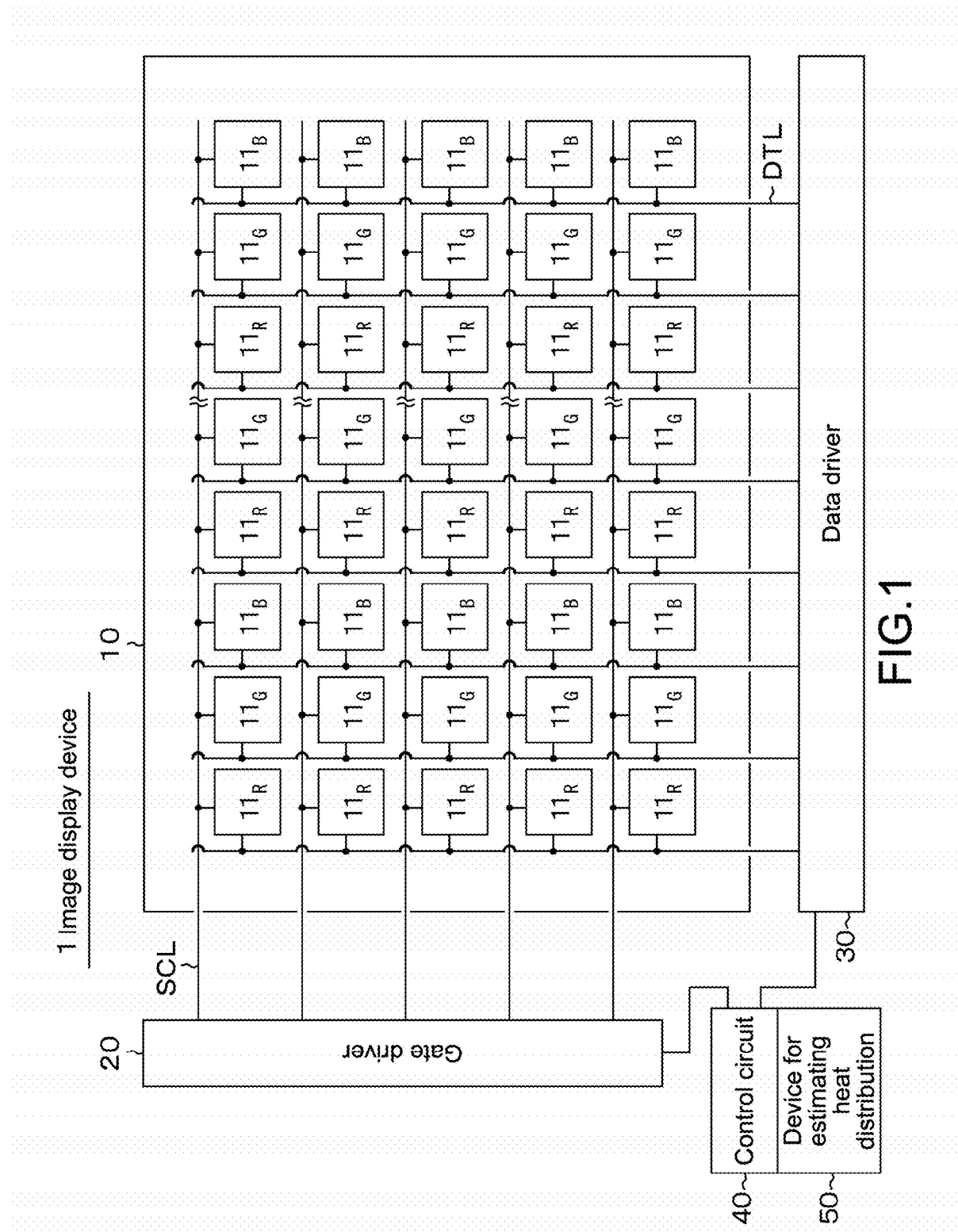
FIG. 1 is a conceptual diagram of an image display device according to Embodiment 1 of the present disclosure.

Hereinafter, an Embodiment of the present disclosure will be described with reference to the drawings. However, the present disclosure is not limited to the Embodiment, and various numerical values or materials in the Embodiment are given for exemplary purposes. It should be noted that a description will be made in the following order.
1. Method of estimating heat distribution of image display unit, device for estimating heat distribution of image display unit, image display device, electronic apparatus including image display device, and program according to Embodiment of present disclosure, and general description
2. Embodiment 1
3. Application examples (examples of electronic apparatus), and others (Method of Estimating Heat Distribution of Image Display Unit, Device for Estimating Heat Distribution of Image Display Unit, Image Display Device, Electronic Apparatus Including Image Display Device, and Program According to Embodiment of Present Disclosure, and General Description)

The method of estimating heat distribution of an image display unit, the device for estimating heat distribution of an image display unit, the image display device, or the program according to the first embodiment of the present disclosure (hereinafter, collectively referred to as the present disclosure in some cases) may have a configuration in which a value of the first heat distribution table is multiplied by a predetermined temperature conversion coefficient to acquire temperature distribution information of the image display unit. In this case, a value of environmental temperature may be added to the value obtained by multiplying the value of the first heat distribution table by the predetermined temperature conversion coefficient to acquire the temperature distribution information of the image display unit.

In the present disclosure including the above-mentioned favorable configurations, a value of an offset table for each area that stores, corresponding to the display surface, an offset value representing an amount of heat generation of a heat source different from the image display unit, which corresponds to a position of the pixel area, may be added to a second heat distribution table to update the second heat distribution table, and a new second heat distribution table may be created by performing a two-dimensional low pass filter process on the updated second heat distribution table before multiplying a value of the processed second heat distribution table by a predetermined heat dissipation coefficient, at every predetermined period. In this case, a value of the second heat distribution table may be multiplied by a predetermined temperature conversion coefficient to acquire temperature distribution information of the image display unit related to the heat source different from the image display unit. The heat source different from the image display unit may be a heat source arranged on a back surface of the pixel area.

In the configuration in which a value of an offset table for each area that stores, corresponding to the display surface, an offset value representing an amount of heat generation of a heat source different from the image display unit, which corresponds to a position of the pixel area, is added to a second heat distribution table to update the second heat distribution table, and a new second heat distribution table is created by performing a two-dimensional low pass filter process is performed on the updated second heat distribution table before multiplying a value of the processed second heat distribution table by a predetermined heat dissipation coefficient, at every predetermined period, a value obtained by adding the value of the first heat distribution table to the value of the second heat distribution table may be multiplied by a predetermined temperature conversion coefficient to acquire the temperature distribution information of the image display unit. In this case, a value of environmental temperature may be added to the value obtained by multiplying the value obtained by adding the first heat distribution table to the second heat distribution table by the predetermined temperature conversion coefficient to acquire the temperature distribution information of the image display unit.

Alternatively, in the configuration to calculate, based on image data, an average current value of a pixel area in a display surface, the pixel area including at least one pixel in an image display unit, the image display unit including a plurality of pixels arranged therein, to calculate heat generation amount data by multiplying the calculated average current value by a predetermined current-heat conversion coefficient to convert the calculated average current value into a value corresponding to an amount of heat generation, and to add the heat generation amount data to a value of a first heat distribution table to update the first heat distribution table, and creating a new first heat distribution table by performing a two-dimensional low pass filter process on the updated first heat distribution table before multiplying a value of the processed first heat distribution table by a predetermined heat dissipation coefficient, at every predetermined period, a value of an offset table for each area that stores, in the display area, an offset value representing an amount of heat generation of a heat source different from the image display unit, which corresponds to a position of the pixel area, may be added to the value of the first heat distribution table to update the first heat distribution table, at every predetermined period. The heat source different from the image display unit may be a heat source arranged on a back surface of the pixel area.

Then, the value of the first heat distribution table may be multiplied by a predetermined temperature conversion coefficient to acquire the temperature distribution information of the image display unit. In this case, a value of environmental temperature may be added to the value obtained by multiplying the value of the first heat distribution table by the predetermined temperature conversion coefficient to acquire the temperature distribution information of the image display unit.

In the present disclosure, the image data input to the image display unit only needs to have a well-known configuration and structure, and the brightness information can be acquired from image data based on a well-known method. Moreover, the pixel area includes at least one pixel or a pixel unit to be described later. Specifically, the pixel area may include one pixel. Alternatively, the pixel area may include m×n (m and n represent natural numbers of 2 or more, e.g., 3×3, 6×6, and 9×9) pixels. The temperature distribution of the image display unit specifically represents temperature distribution of the pixel that displays an image in the image display unit based on image data.

In the present disclosure, as the current-heat conversion coefficient (coefficient $K_{ch}$ to be described later), the heat dissipation coefficient (coefficient $K_r$ to be described later), and the temperature conversion coefficient (coefficient $K_{tc}$ to be described later), a value with which favorable estimation can be performed based on the results of actual measurement performed using an actual machine, for example, only has to be selected for use. It should be noted that the same shall apply to the value stored in the offset table for each area or the like.

The two-dimensional low pass filter may include a well-known filter such as a moving average filter and a weighted average filter. The size of the operator is not limited to 3×3, and only needs to be appropriately set depending on designing or the like.

The device for estimating heat distribution of an image display unit according to this Embodiment may have an independent circuit configuration. However, the device for estimating heat distribution of an image display unit favorably has a configuration and structure in which it is included in a control circuit or the like that controls the image display device according to this Embodiment, from a viewpoint of simplicity of the entire apparatus. The image display device and the control circuit that controls the image display device may include a well-known image display device and a well-known control circuit, respectively.

The temperature estimation may be performed for each image display frame, for each predetermined display frame, or at every predetermined period.

In the present disclosure including the above-mentioned favorable Embodiment and configuration, the pixel may include a self-light emitting type light emitting element. Alternatively, the image display device may include an organic electroluminescence display apparatus (organic EL display apparatus), and the pixel may include an organic electroluminescence element (organic EL element). It should be noted that the number of types of the pixel is one in the case where the image display device performs monochrome display. On the other hand, one pixel unit may include three types of pixels (e.g., a red light emitting pixel that emits red light, a green light emitting pixel that emits green light, and a blue light emitting pixel that emits blue light) in the case where the image display device performs color display. Furthermore, in addition to these three types of pixels, the pixel unit may include four or more types of pixels, e.g., a pixel that emits white light to improve the brightness, a pixel that emits complementary color light to enlarge the color reproduction range, a pixel that emits yellow light to enlarge the color reproduction range, and a pixel that emits yellow and cyan light to enlarge the color reproduction range. It should be noted that in these cases, these pixels are referred to also as "sub-pixels."

In the present disclosure, in the case where the light emitting element includes the organic EL element, an organic layer (a light emitting unit) constituting the organic EL element includes a luminescent layer formed of an organic light emission material. Specifically, for example, the organic layer may have a laminated structure of a hole transport layer. a luminescent layer, and an electron transport layer, a laminated structure of a hole transport layer and a luminescent layer that servers also as an electron transport layer, or a laminated structure of a hole injection layer, a hole transport layer, a luminescent layer, an electron transport layer, and an electron injection layer.

The image display unit includes a plurality of pixels or a plurality of pixel units arranged therein. It should be noted that if the number of pixels or pixel units is represented by (M, N), examples of the resolution for image display include (3840, 2160) and (7680, 4320) in addition to VGA (640, 480), S-VGA (800, 600), XGA (1024, 768), APRC (1152, 900), S-XGA (1280, 1024), U-XGA (1600, 1200), HD-TV (1920, 1080), and Q-XGA (2048, 1536). However, the resolution for image display is not limited thereto. Examples of the arrangement of the pixels include a stripe arrangement, a diagonal arrangement, a delta arrangement, and a rectangular arrangement.

The image display device according to this Embodiment can be used as a monitoring device constituting a personal computer or a monitoring device incorporated in a mobile phone such as a smartphone, a television receiver, a personal digital assistant (PDA), or a game machine, for example.

Various conditions described herein are satisfied in the case where the conditions are satisfied not only strictly but also substantially. Various irregularities caused in designing or manufacturing are acceptable.

Embodiment 1

An Embodiment 1 relates to the method of estimating heat distribution of an image display unit, the device for estimating heat distribution of an image display unit, the image display device, the electronic apparatus including the image display device, and the program according to the first embodiment of the present disclosure. FIG. 1 is a conceptual diagram of the image display device.

A device for estimating heat distribution of an image display unit 50 is configured to estimate the temperature distribution of an image display unit including a plurality of pixels arranged herein (image display unit including a plurality of pixels 11 ($11_R$, $11_G$, and $11_B$) arranged therein) 10. Each of the pixels includes a light emitting element. Moreover, an image display device 1 includes the device for estimating heat distribution of an image display unit 50.

A method of estimating heat distribution of an image display unit according to the Embodiment 1 is a device for estimating heat distribution of an image display unit that estimates heat distribution of an image display unit including the plurality of pixels 11 arranged therein, which is configured to calculate, based on image data, an average current value of a pixel area in a display surface, the pixel area including at least one pixel in an image display unit, the image display unit including a plurality of pixels arranged therein, to calculate heat generation amount data by multiplying the calculated average current value by a predetermined current-heat conversion coefficient to convert the calculated average current value into a value corresponding to an amount of heat generation, and to add the heat generation amount data to a value of a first heat distribution table to update the first heat distribution table, and creating a new first heat distribution table by performing a two-dimensional low pass filter process on the updated first heat distribution table before multiplying a value of the processed first heat distribution table by a predetermined heat dissipation coefficient, at every predetermined period.

Moreover, a program according to the Embodiment 1 is a program that causes a computer to execute the steps of calculating, based on image data, an average current value of a pixel area in a display surface, the pixel area including at least one pixel in an image display unit, the image display unit including a plurality of pixels arranged therein, calculating heat generation amount data by multiplying the calculated average current value by a predetermined current-heat conversion coefficient to convert the calculated average current value into a value corresponding to an amount of heat generation, and adding the heat generation amount data to a value of a first heat distribution table to update the first heat distribution table, and creating a new first heat distribution table by performing a two-dimensional low pass filter process on the updated first heat distribution table before multiplying a value of the processed first heat distribution table by a predetermined heat dissipation coefficient, at every predetermined period. The device for estimating heat distribution of an image display unit 50 is configured to estimate the heat distribution by the operation of the program.

In the image display unit 10 shown in FIG. 1, the light emitting element includes a self-light emitting type light emitting element, specifically, organic EL element. The image display unit 10 includes the organic EL display apparatus that performs color display. If the number of pixel units is represented by (M, N), the number of pixel units is (1920, 1080), for example. One pixel unit includes three pixels, i.e., the red light emitting pixel $11_R$ that emits red light, the green light emitting pixel $11_G$ that emits green light, and the blue light emitting pixel $11_B$ that emits blue light. The image display device 1 includes a gate driver 20 and a data driver 30. The gate driver 20 is configured to control (drive) each scanning line SCL, and the data driver 30 is configured to supply image data and brightness information (image signal and a brightness signal) to a pixel through a signal line DTL. The operations of the gate driver 20 and the data driver 30 are controlled by a control circuit 40. Moreover, the device for estimating heat distribution of an image display unit 50 is included in the control circuit 40. Because the image display device 1, the control circuit 40 that controls the image display device 1, the gate driver 20, and the data driver 30 can be a well-known image display device, control circuit, scanning line control circuit, and signal line control circuit, respectively, the detailed description thereof will be omitted.

Image data input to the image display unit 10 is a video signal in television broadcast, which is transmitted from a broadcast station, for example. The brightness information (brightness signal Y) can be obtained from image data based on a well-known method. The temperature distribution of the image display unit 10 is caused in the pixels 11 constituting the image display unit 10. Typically, a larger amount of current flows as the level of three stimulation values XYZ of an image or RGB signal increases, and the temperature of the pixels 11 increases.

Figure 2:
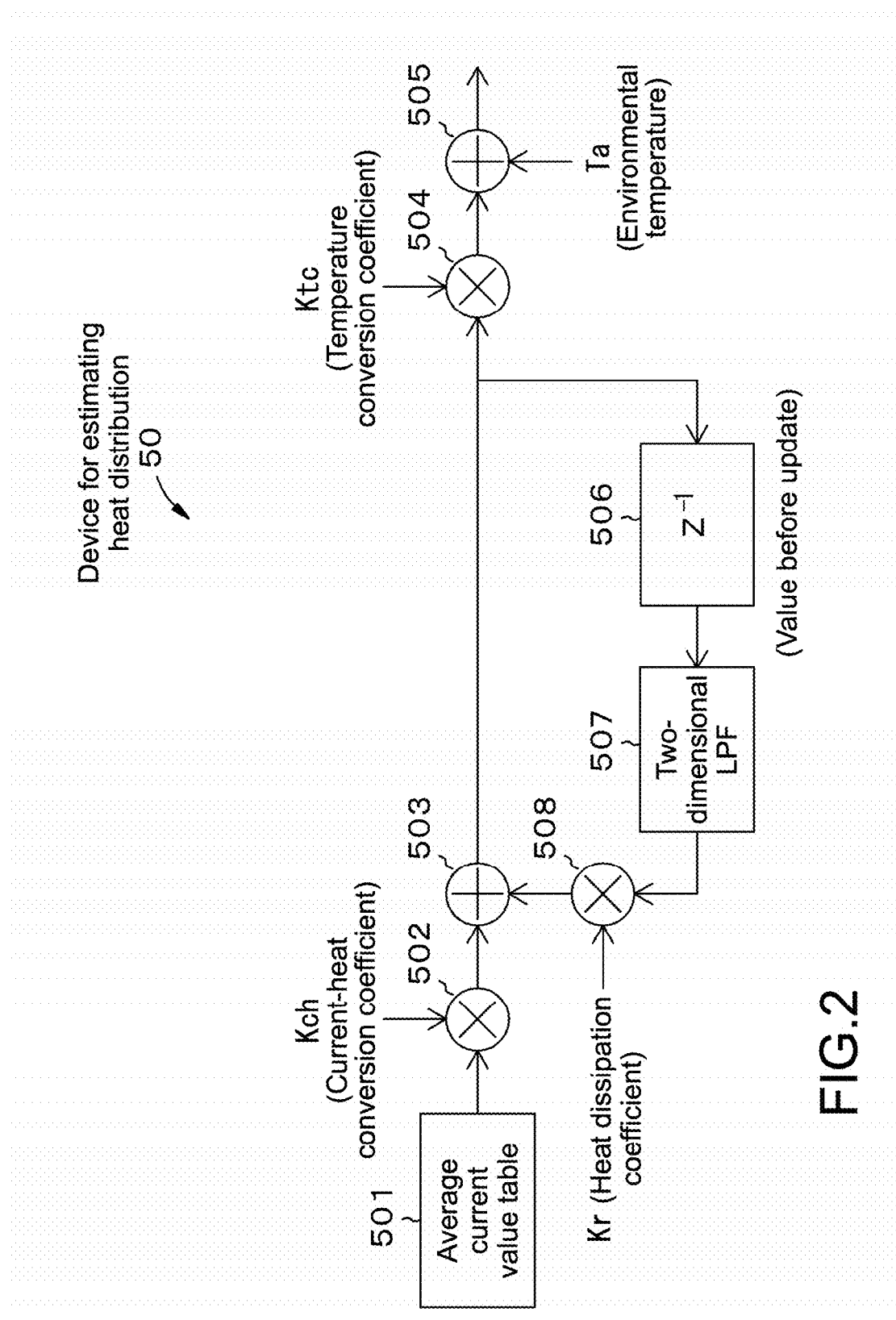
FIG. 2 is a schematic diagram for explaining the basic configuration or operation of a device for estimating heat distribution of an image display unit.

FIG. 2 is a schematic diagram for explaining the basic configuration or operation of the device for estimating heat distribution of an image display unit according to the Embodiment 1.

The device for estimating heat distribution of an image display unit 50 is configured to calculate, based on image data, an average current value of a pixel area including at least one pixel in a display surface to create an average current value table 501 at every predetermined period (e.g., every 10 frames).

Then, the device for estimating heat distribution of an image display unit 50 calculates heat generation amount data by multiplying the calculated average current value by a predetermined current-heat conversion coefficient to convert the calculated average current value into a value corresponding to an amount of heat generation. Specifically, a multiplier 502 multiplies the value of the average current value table 501 by the predetermined current-heat conversion coefficient $K_{ch}$ that defines the relationship between the current and the heat amount.

Next, the device for estimating heat distribution of an image display unit 50 adds the heat generation amount data to a value of a first heat distribution table to update the first heat distribution table, and creates a new first heat distribution table by performing a two-dimensional low pass filter process on the updated first heat distribution table before multiplying a value of the processed first heat distribution table by a predetermined heat dissipation coefficient.

Specifically, an adder 503 adds the heat dissipation amount to the value of the first heat distribution table to update the first heat distribution table. Then, a two-dimensional low pass filter 507 performs a process on the value stored in a buffer 506. After that, a multiplier 508 multiplies the processed value by the heat dissipation coefficient $K_r$ defined based on the heat dissipation properties of the image display unit 10. Accordingly, a new first heat distribution table is acquired.

Moreover, the value of the heat distribution table is multiplied by a predetermined temperature conversion coefficient to acquire the temperature distribution information of the image display unit 10. Furthermore, the value of environmental temperature is added to the value obtained by multiplying the value of the heat distribution table by the predetermined temperature conversion coefficient, to acquire the temperature distribution information of the image display unit 10.

Specifically, a multiplier 504 multiplies the output of the loop shown in FIG. 2 (in other words, value of the updated first heat distribution table) by the predetermined temperature conversion coefficient $K_{tc}$ for converting the heat amount into temperature. After that, an adder 505 adds a value Ta of environmental temperature acquired by a temperature sensor (not shown) thereto.

Hereinabove, the basic configuration or operation of the device for estimating heat distribution of an image display unit has been described.

It should be noted that although the temperature change due to the operation of the image display unit 10 can be estimated by the above-mentioned operation, it may be impossible to estimate the influence of another heat source different from the image display unit 10. Next, for example, a configuration or operation in the case where the influence of heat generation of a circuit or the like (not shown) arranged on the back surface of the image display unit 10 is estimated will be described. In the following description, the heat source different from the image display unit 10 is a heat source arranged on the back surface of the pixel area.

Figure 3:
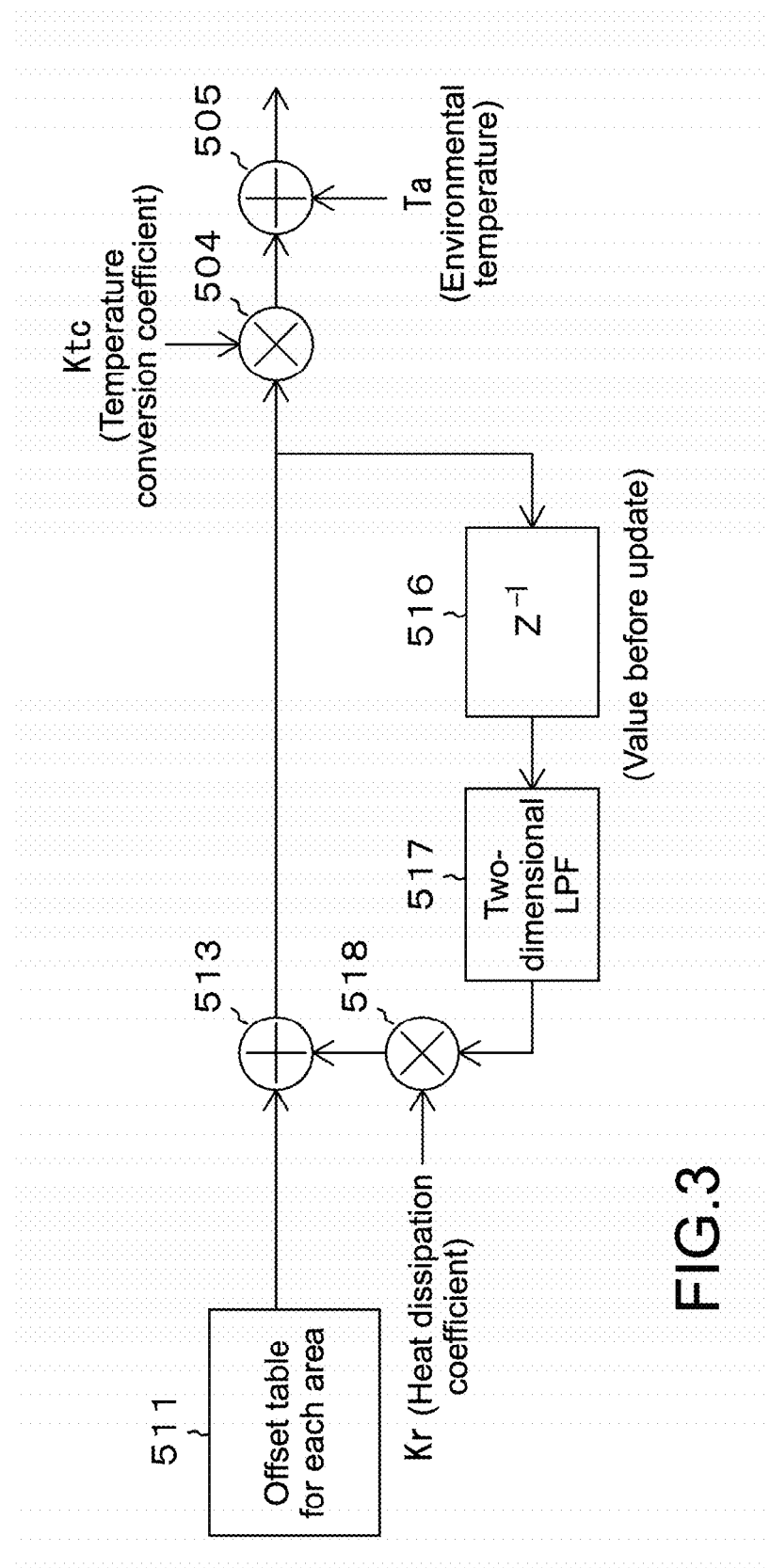
FIG. 3 is a schematic diagram for explaining the configuration or operation in the case where the influence of heat generation of a circuit or the like arranged on the back surface of the image display unit is estimated.

FIG. 3 is a schematic diagram for explaining the configuration or operation in the case where the influence of heat generation of a circuit or the like arranged on the back surface of the image display unit is estimated.

For example, an offset table for each area 511 that stores an offset value representing the amount of heat generation of a heat source different from the image display unit 10, which corresponds to the position of the pixel area, so that the offset value corresponds to the entire display surface, is prepared. In this table, for example, a value corresponding to the heat amount generated by a power source circuit or the like arranged on the back surface of the image display unit 10 at the time of the operation of the image display device is stored in advance as a predetermined constant. The heat source different from the image display unit 10 is a heat source arranged on the back surface of the pixel area.

By causing the same loop as that shown in FIG. 2 to operate for the offset table for each area 511 at every predetermined period, it is possible to estimate the heat distribution of the heat source different from the image display unit 10, which corresponds to the position of the pixel area.

Specifically, a value of an offset table for each area that stores, corresponding to the display surface, an offset value representing an amount of heat generation of a heat source different from the image display unit, which corresponds to a position of the pixel area, is added to a second heat distribution table to update the second heat distribution table, and a new second heat distribution table is created by performing a two-dimensional low pass filter process is performed on the updated second heat distribution table before multiplying a value of the processed second heat distribution table by a predetermined heat dissipation coefficient, at every predetermined period.

Specifically, an adder 513 adds heat generation amount data to the second heat distribution table to update the second heat distribution table. Then, the process of a two-dimensional low pass filter 517 is performed on the value stored in a buffer 516. After that, a multiplier 518 multiplies the processed value by the heat dissipation coefficient $K_r$ defined based on the heat dissipation properties of the image display unit 10. Thus, a new second heat distribution table is acquired.

Figure 4:
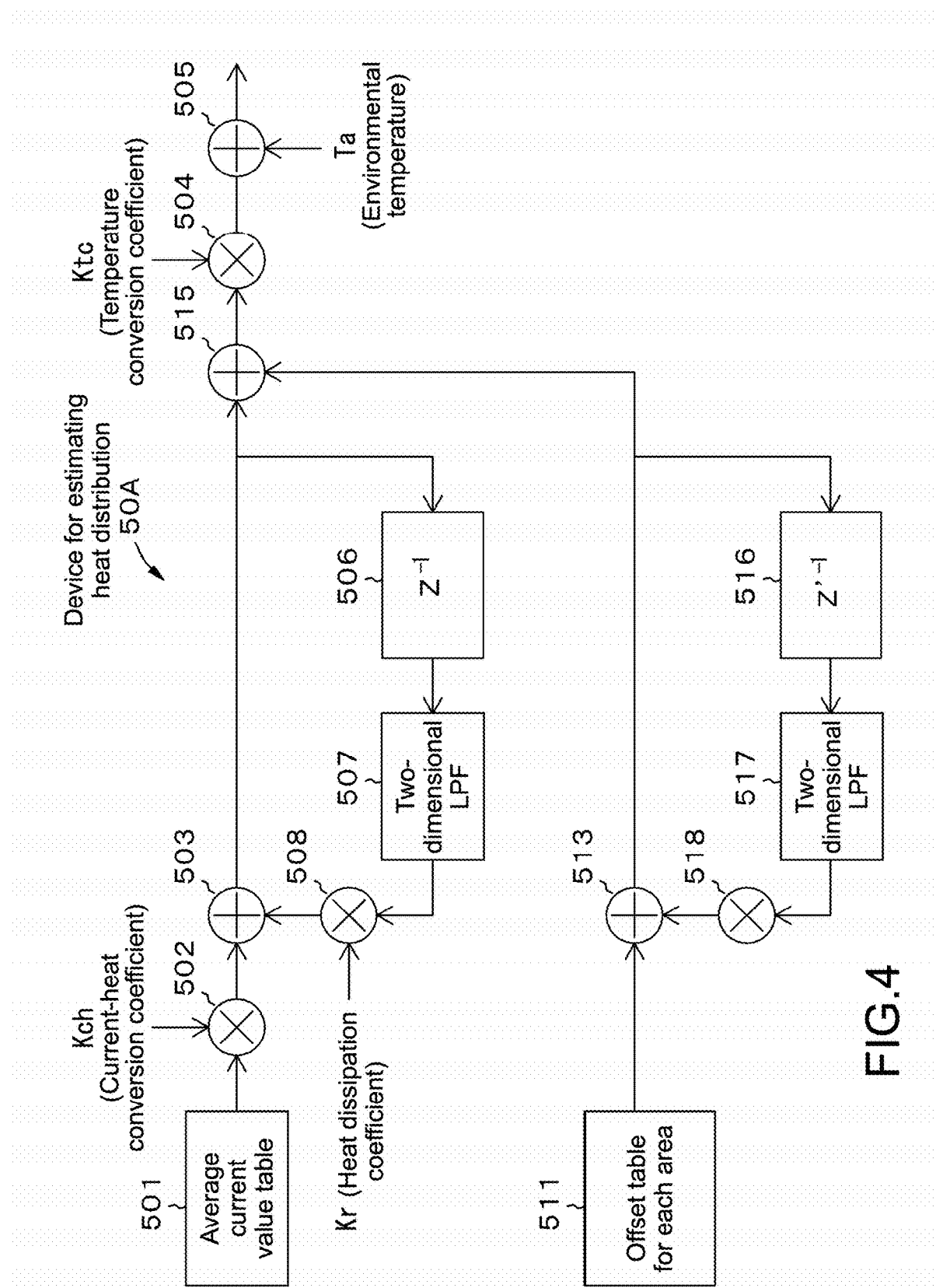
FIG. 4 is a schematic diagram for explaining the configuration or operation of a device for estimating heat distribution of an image display unit according to a modified example.

FIG. 4 is a schematic diagram for explaining the configuration or operation of a device for estimating heat distribution of an image display unit according to a modified example.

A device for estimating heat distribution of an image display unit 50A has a form obtained by adding the configuration shown in FIG. 3 to the device for estimating heat distribution of an image display unit 50 shown in FIG. 2, and is capable of estimating the heat distribution, taking into account of the influence of self-heating of the image display unit 10 and heat generation of a circuit or the like arranged on the back surface of the image display unit 10.

In the configuration shown in FIG. 4, the temperature distribution information of the image display unit is acquired by multiplying the value obtained by adding the value of the first heat distribution table to the value of the second heat distribution table by a predetermined temperature conversion coefficient. Then, it is possible to acquire the temperature distribution information of the image display unit by adding the value of environmental temperature to the value obtained by multiplying the value obtained by adding the first heat distribution table to the second heat distribution table by a predetermined temperature conversion coefficient.

Specifically, an adder 515 adds the value of the first heat distribution table to the value of the second heat distribution table, and the multiplier 504 multiplies the value thus obtained by the predetermined temperature conversion coefficient $K_{tc}$ for converting the heat amount into temperature. After that, for example, the adder 505 adds the value Ta of environmental temperature acquired by a temperature sensor (not shown) thereto.

Figure 5:
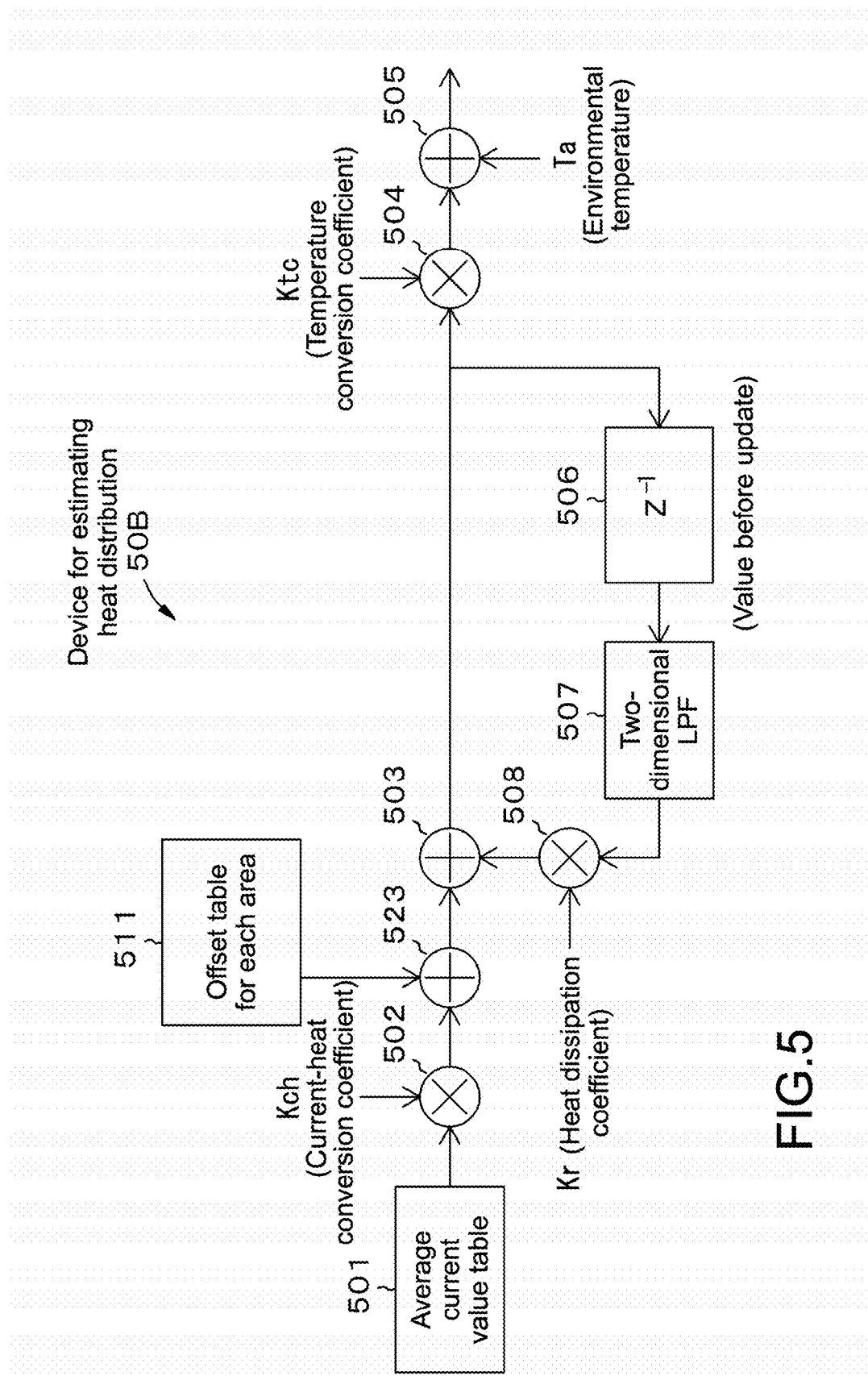
FIG. 5 is a schematic diagram for explaining the basic configuration or operation of a device for estimating heat distribution of an image display unit according to another modified example.

FIG. 5 is a schematic diagram for explaining the basic configuration or operation of a device for estimating heat distribution of an image display unit according to another modified example.

The device for estimating heat distribution of an image display unit 50A shown in FIG. 4 has a problem of a large circuit configuration because it has two loops including a buffer and a two-dimensional low pass filter.

In this regard, a device for estimating heat distribution of an image display unit 50B shown in FIG. 5 is configured to add the value of the offset table for each area that stores, in the entire display surface, an offset value representing the amount of heat generation of a heat source different from the image display unit, which corresponds to a position of the pixel area, to the first heat distribution table, at every predetermined period to update the first heat distribution table.

Specifically, an adder 523 is added between the multiplier 502 and the adder 503 shown in FIG. 2, and the value of the offset table for each area 511 is added thereto. Accordingly, the loops including a buffer and a two-dimensional low pass filter can be integrated, and it is possible to make the circuit configuration simple.

Also with this configuration, it is possible to acquire the temperature distribution information of the image display unit by multiplying the value of the first heat distribution table by the predetermined temperature conversion coefficient. Furthermore, it is possible to acquire the temperature distribution information of the image display unit by adding the value of environmental temperature to the value obtained by multiplying the value of the first heat distribution table by the predetermined temperature conversion coefficient.

The results of estimation performed by the device for estimating heat distribution of an image display unit having the configuration shown in FIG. 5 will be described with reference to FIG. 6, FIG. 7, FIG. 8, and FIG. 9.

Figure 6A:
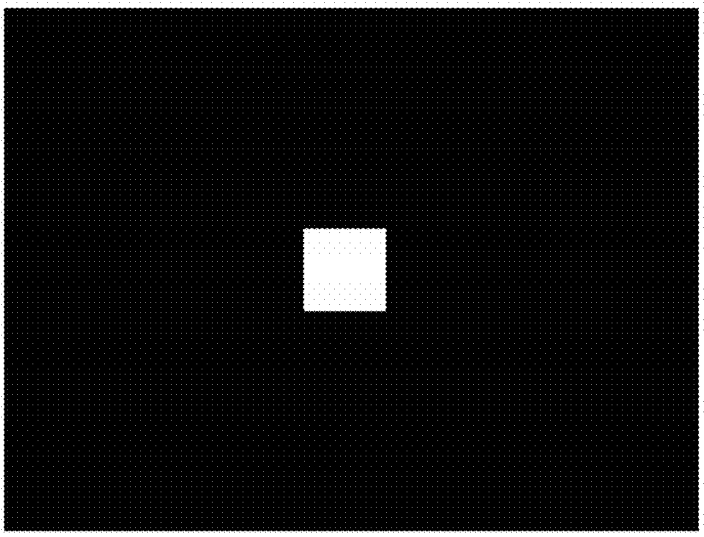
FIG. 6A is an image schematically showing a white display pattern of 100×100 pixels.
Figure 6B:
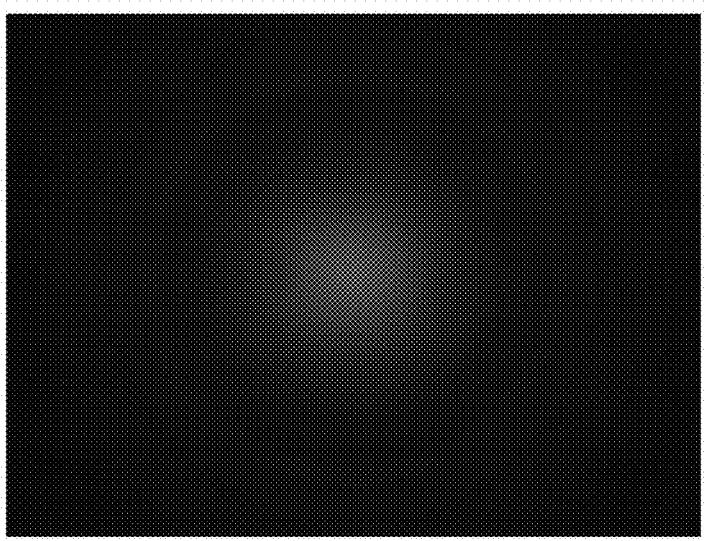
FIG. 6B is an image for explaining the results obtained by estimating the temperature distribution information at the time when the pattern shown in FIG. 6A is displayed on the image display device.
Figure 6C:
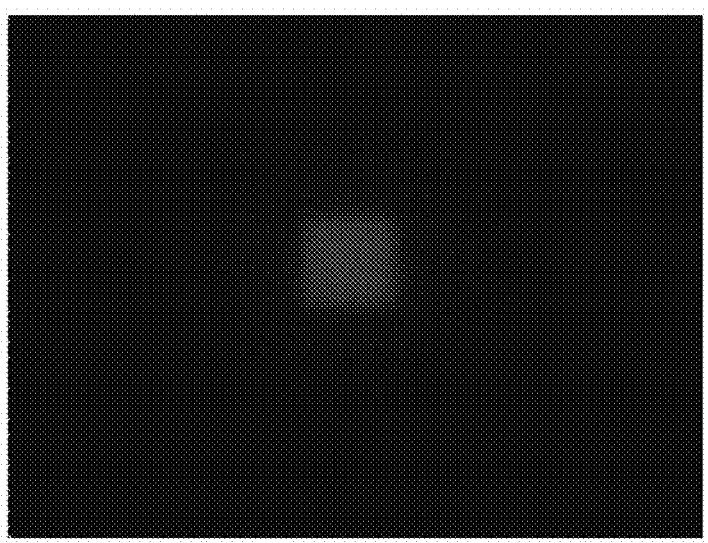
FIG. 6C is an image for explaining the results obtained by actually measuring the temperature distribution information at the time when the pattern shown in FIG. 6A is displayed on the image display device.

The image shown in FIG. 6A is displayed on the image display unit 10 of the image display device 1. This is a white display pattern of 100×100 pixels with a black background. A thermography image obtained by capturing the image by thermography is shown in FIG. 6B. The results obtained by estimating the temperature of the image display unit 10 based on this image are shown in FIG. 6C. It can be seen that the thermography image (see FIG. 6B) moderately corresponds to the estimation results of temperature distribution (see FIG. 6C).

Figure 7A:
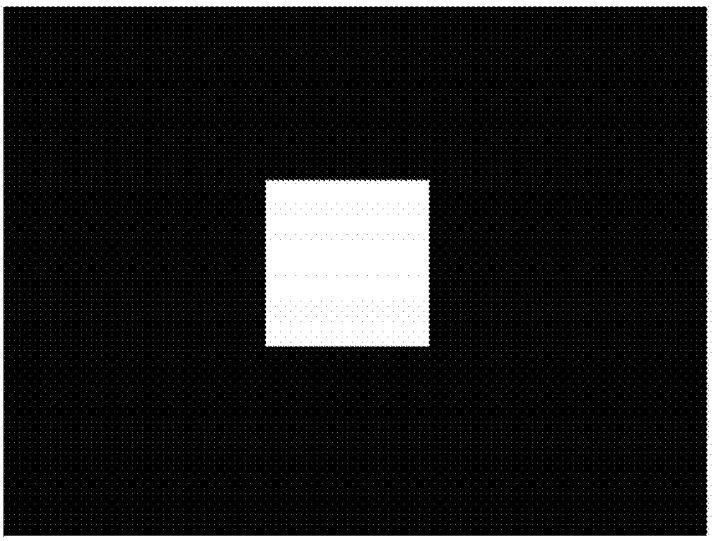
FIG. 7A is an image schematically showing a white display pattern of 200×200 pixels.
Figure 7B:
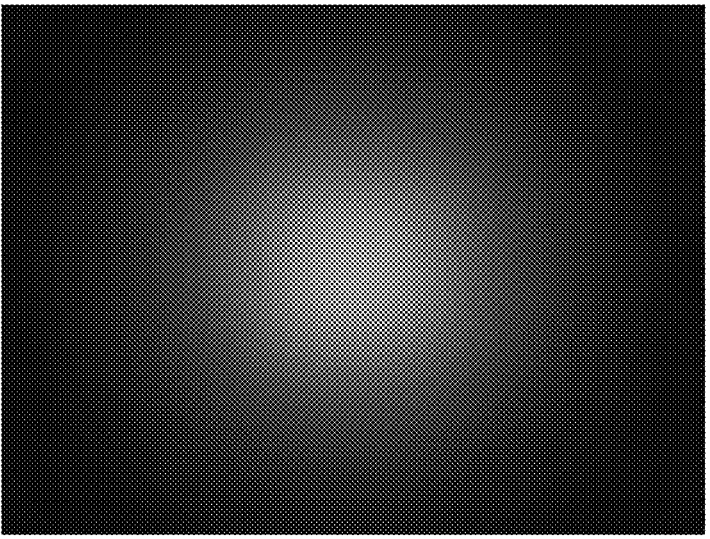
FIG. 7B is an image for explaining the results obtained by estimating the temperature distribution information at the time when the pattern shown in FIG. 7A is displayed on the image display device.
Figure 7C:
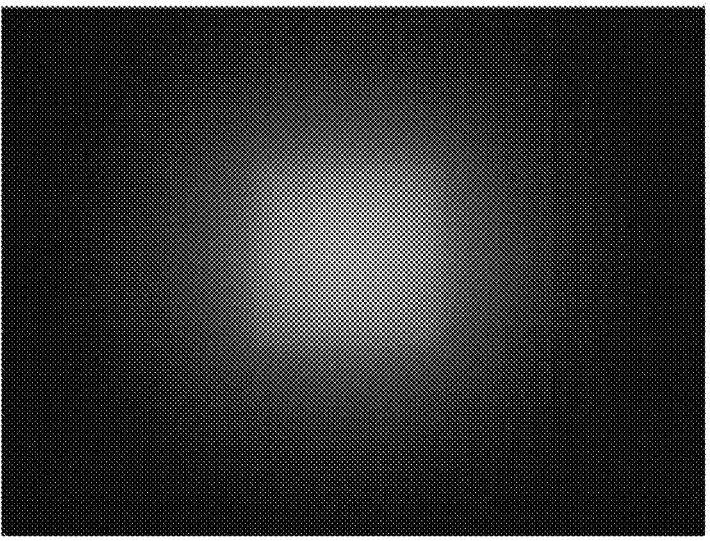
FIG. 7C is an image for explaining the results obtained by actually measuring the temperature distribution information at the time when the pattern shown in FIG. 7A is displayed on the image display device.

The image shown in FIG. 7A is displayed on the image display unit 10 of the image display device 1. This is a white display pattern of 200×200 pixels with a black background. A thermography image obtained by capturing the image by thermography is shown in FIG. 7B. The results obtained by estimating the temperature of the image display unit 10 based on this image are shown in FIG. 7C. It can be seen that the thermography image (see FIG. 7B) moderately corresponds to the estimation results of temperature distribution (see FIG. 7C).

Figure 8A:
FIG. 8A is an image schematically showing a display pattern of a still object.
Figure 8B:
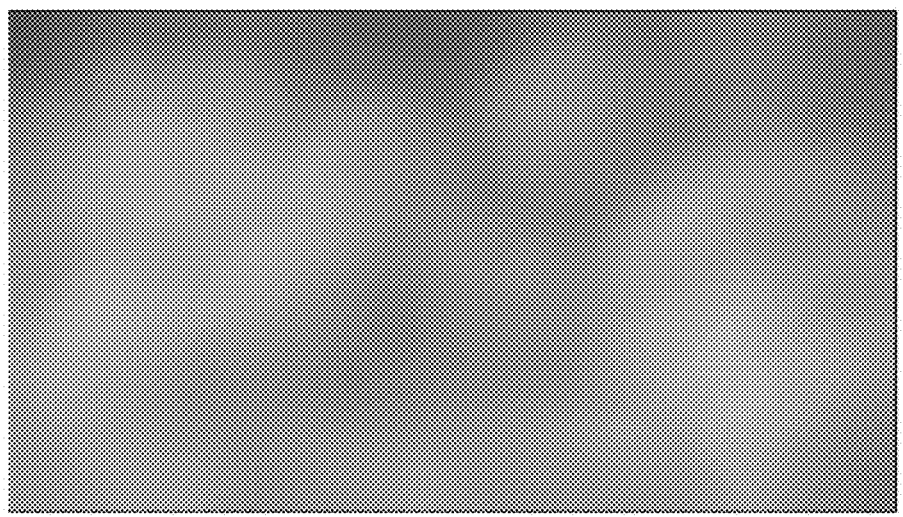
FIG. 8B is an image for explaining the results obtained by estimating the temperature distribution information at the time when the pattern shown in FIG. 8A is displayed on the image display device.
Figure 8C:
FIG. 8C is an image for explaining the results obtained by actually measuring the temperature distribution information at the time when the pattern shown in FIG. 8A is displayed on the image display device.

The image shown in FIG. 8A is displayed on the image display unit 10 of the image display device 1. This is a still object display pattern with gradation. A thermography image obtained by capturing the image by thermography is shown in FIG. 8B. The results obtained by estimating the temperature of the image display unit 10 based on this image are shown in FIG. 8C. It can be seen that the thermography image (see FIG. 8B) moderately corresponds to the estimation results of temperature distribution (see FIG. 8C).

Application Examples

Examples of Electronic Apparatus

Examples of applying the above-mentioned image display device to an electronic apparatus will be described. Examples of the electronic apparatus include an electronic apparatus that displays, as an image or video, a video signal input from the outside or a video signal generated therein.

Application Example 1

FIG. 9A and FIG. 9B each show the appearance of a smartphone to which the image display device according to the above-mentioned Embodiment is applied. For example, smartphones 60 and 60' include display units 61 and 61', respectively. These display units 61 and 61' are configured by the image display device according to the above-mentioned Embodiment. By applying the image display device according to the above-mentioned Embodiment, it is possible to accurately estimate the temperature. Therefore, it is possible to contribute to the improvement of the quality of the smartphones 60 and 60'.

Application Example 2

Figure 10:
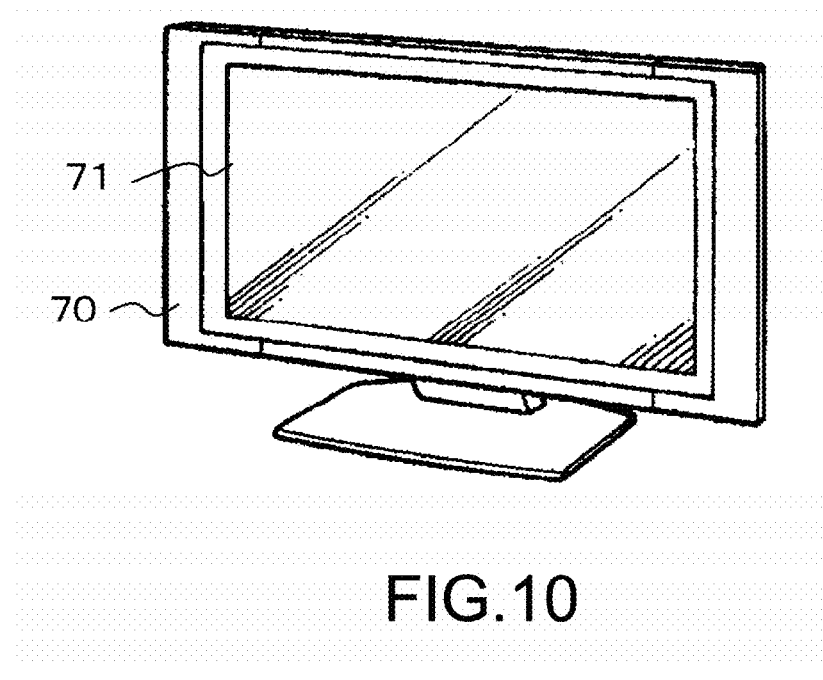
FIG. 10 is a perspective view showing an application example 2 of the display apparatus according to the Embodiment.

FIG. 10 shows the appearance of a television receiver to which the image display device according to the above-mentioned Embodiment is applied. A television receiver 70 includes, for example, a video display screen unit 71. The video display screen unit 71 is configured by the display apparatus according to the Embodiment. By applying the display apparatus according to the Embodiment, it is possible to accurately estimate the temperature. Therefore, it is possible to contribute to the improvement of the quality of the television receiver 70.

Hereinabove, the Embodiment of the present disclosure has been specifically described. However, the Embodiment of the present disclosure is not limited to the above-mentioned Embodiment and various modifications can be made based on the technical ideas of the present disclosure. For example, the values, configuration, substrate, raw materials, processes, and the like described in the above-mentioned Embodiment are given for illustrative purposes only, and values, configuration, substrate, raw materials, processes and the like different from these may be uses as necessary.

It should be noted that the present disclosure may also take the following configurations.

(1) A method of estimating heat distribution of an image display unit, including:

calculating, based on image data, an average current value of a pixel area in a display surface, the pixel area including at least one pixel in an image display unit, the image display unit including a plurality of pixels arranged therein;

calculating heat generation amount data by multiplying the calculated average current value by a predetermined current-heat conversion coefficient to convert the calculated average current value into a value corresponding to an amount of heat generation; and adding the heat generation amount data to a value of a first heat distribution table to update the first heat distribution table, and creating a new first heat distribution table by performing a two-dimensional low pass filter process on the updated first heat distribution table before multiplying a value of the processed first heat distribution table by a predetermined heat dissipation coefficient, at every predetermined period.

(2) The method of estimating heat distribution of an image display unit according to (1) above, in which a value of the first heat distribution table is multiplied by a predetermined temperature conversion coefficient to acquire temperature distribution information of the image display unit.

(3) The method of estimating heat distribution of an image display unit according to (2) above, in which a value of environmental temperature is added to the value obtained by multiplying the value of the first heat distribution table by the predetermined temperature conversion coefficient to acquire the temperature distribution information of the image display unit.

(4) The method of estimating heat distribution of an image display unit according to (1) above, in which a value of an offset table for each area that stores, corresponding to the display surface, an offset value representing an amount of heat generation of a heat source different from the image display unit, which corresponds to a position of the pixel area, is added to a second heat distribution table to update the second heat distribution table, and a new second heat distribution table is created by performing a two-dimensional low pass filter process on the updated second heat distribution table before multiplying a value of the processed second heat distribution table by a predetermined heat dissipation coefficient, at every predetermined period.

(5) The method of estimating heat distribution of an image display unit according to (4) above, in which a value of the second heat distribution table is multiplied by a predetermined temperature conversion coefficient to acquire temperature distribution information of the image display unit related to the heat source different from the image display unit.

(6) The method of estimating heat distribution of an image display unit according to (4) above, in which the heat source different from the image display unit is a heat source arranged on a back surface of the pixel area.

(7) The method of estimating heat distribution of an image display unit according to (4) above, in which a value obtained by adding the value of the first heat distribution table to the value of the second heat distribution table is multiplied by a predetermined temperature conversion coefficient to acquire the temperature distribution information of the image display unit.

(8) The method of estimating heat distribution of an image display unit according to (7) above, in which a value of environmental temperature is added to the value obtained by multiplying the value obtained by adding the first heat distribution table to the second heat distribution table by the predetermined temperature conversion coefficient to acquire the temperature distribution information of the image display unit.

(9) The method of estimating heat distribution of an image display unit according to (1) above, in which a value of an offset table for each area that stores, in the display area, an offset value representing an amount of heat generation of a heat source different from the image display unit, which corresponds to a position of the pixel area, is added to the value of the first heat distribution table to update the first heat distribution table, at every predetermined period.

(10) The method of estimating heat distribution of an image display unit according to (9) above, in which the heat source different from the image display unit is a heat source arranged on a back surface of the pixel area.

(11) The method of estimating heat distribution of an image display unit according to (9) above, in which the value of the first heat distribution table is multiplied by a predetermined temperature conversion coefficient to acquire the temperature distribution information of the image display unit.

(12) The method of estimating heat distribution of an image display unit according to (11) above, in which a value of environmental temperature is added to the value obtained by multiplying the value of the first heat distribution table by the predetermined temperature conversion coefficient to acquire the temperature distribution information of the image display unit.

(13) A device for estimating heat distribution of an image display unit that estimates heat distribution of an image display unit including a plurality of pixels arranged therein, which is configured to calculate, based on image data, an average current value of a pixel area in a display surface, the pixel area including at least one pixel in an image display unit, the image display unit including a plurality of pixels arranged therein, to calculate heat generation amount data by multiplying the calculated average current value by a predetermined current-heat conversion coefficient to convert the calculated average current value into a value corresponding to an amount of heat generation, and to add the heat generation amount data to a value of a first heat distribution table to update the first heat distribution table, and creating a new first heat distribution table by performing a two-dimensional low pass filter process on the updated first heat distribution table before multiplying a value of the processed first heat distribution table by a predetermined heat dissipation coefficient, at every predetermined period.

(14) The device for estimating heat distribution of an image display unit according to (13) above, in which a value of the first heat distribution table is multiplied by a predetermined temperature conversion coefficient to acquire temperature distribution information of the image display unit.

(15) The device for estimating heat distribution of an image display unit according to (14) above, in which a value of environmental temperature is added to the value obtained by multiplying the value of the first heat distribution table by the predetermined temperature conversion coefficient to acquire the temperature distribution information of the image display unit.

(16) The device for estimating heat distribution of an image display unit according to (13) above, in which a value of an offset table for each area that stores, corresponding to the display surface, an offset value representing an amount of heat generation of a heat source different from the image display unit, which corresponds to a position of the pixel area, is added to a second heat distribution table to update the second heat distribution table, and a new second heat distribution table is created by performing a two-dimensional low pass filter process on the updated second heat distribution table before multiplying a value of the processed second heat distribution table by a predetermined heat dissipation coefficient, at every predetermined period.

(17) The device for estimating heat distribution of an image display unit according to (16) above, in which a value of the second heat distribution table is multiplied by a predetermined temperature conversion coefficient to acquire temperature distribution information of the image display unit related to the heat source different from the image display unit.

(18) The device for estimating heat distribution of an image display unit according to (16) above, in which the heat source different from the image display unit is a heat source arranged on a back surface of the pixel area.

(19) The device for estimating heat distribution of an image display unit according to (16) above, in which a value obtained by adding the value of the first heat distribution table to the value of the second heat distribution table is multiplied by a predetermined temperature conversion coefficient to acquire the temperature distribution information of the image display unit.

(20) The device for estimating heat distribution of an image display unit according to (19) above, in which a value of environmental temperature is added to the value obtained by multiplying the value obtained by adding the first heat distribution table to the second heat distribution table by the predetermined temperature conversion coefficient to acquire the temperature distribution information of the image display unit.

(21) The device for estimating heat distribution of an image display unit according to (13) above, in which a value of an offset table for each area that stores, in the display area, an offset value representing an amount of heat generation of a heat source different from the image display unit, which corresponds to a position of the pixel area, is added to the value of the first heat distribution table to update the first heat distribution table, at every predetermined period.

(22) The device for estimating heat distribution of an image display unit according to (21) above, in which the heat source different from the image display unit is a heat source arranged on a back surface of the pixel area.

(23) The device for estimating heat distribution of an image display unit according to (21) above, in which the value of the first heat distribution table is multiplied by a predetermined temperature conversion coefficient to acquire the temperature distribution information of the image display unit.

(24) The device for estimating heat distribution of an image display unit according to (23) above, in which a value of environmental temperature is added to the value obtained by multiplying the value of the first heat distribution table by the predetermined temperature conversion coefficient to acquire the temperature distribution information of the image display unit.

(25) An image display device, including a device for estimating heat distribution of an image display unit that estimates heat distribution of an image display unit including a plurality of pixels arranged therein, the device for estimating heat distribution of an image display unit being configured to calculate, based on image data, an average current value of a pixel area in a display surface, the pixel area including at least one pixel in an image display unit, the image display unit including a plurality of pixels arranged therein, to calculate heat generation amount data by multiplying the calculated average current value by a predetermined current-heat conversion coefficient to convert the calculated average current value into a value corresponding to an amount of heat generation, and to add the heat generation amount data to a value of a first heat distribution table to update the first heat distribution table, and creating a new first heat distribution table by performing a two-dimensional low pass filter process on the updated first heat distribution table before multiplying a value of the processed first heat distribution table by a predetermined heat dissipation coefficient, at every predetermined period.

(26) The image display device according to (25) above, in which a value of the first heat distribution table is multiplied by a predetermined temperature conversion coefficient to acquire temperature distribution information of the image display unit.

(27) The image display device according to (26) above, in which a value of environmental temperature is added to the value obtained by multiplying the value of the first heat distribution table by the predetermined temperature conversion coefficient to acquire the temperature distribution information of the image display unit.

(28) The image display device according to (25) above, in which a value of an offset table for each area that stores, corresponding to the display surface, an offset value representing an amount of heat generation of a heat source different from the image display unit, which corresponds to a position of the pixel area, is added to a second heat distribution table to update the second heat distribution table, and a new second heat distribution table is created by performing a two-dimensional low pass filter process on the updated second heat distribution table before multiplying a value of the processed second heat distribution table by a predetermined heat dissipation coefficient, at every predetermined period.

(29) The image display device according to (28) above, in which a value of the second heat distribution table is multiplied by a predetermined temperature conversion coefficient to acquire temperature distribution information of the image display unit related to the heat source different from the image display unit.

(30) The image display device according to (28) above, in which the heat source different from the image display unit is a heat source arranged on a back surface of the pixel area.

(31) The image display device according to (28) above, in which a value obtained by adding the value of the first heat distribution table to the value of the second heat distribution table is multiplied by a predetermined temperature conversion coefficient to acquire the temperature distribution information of the image display unit.

(32) The image display device according to (31) above, in which a value of environmental temperature is added to the value obtained by multiplying the value obtained by adding the first heat distribution table to the second heat distribution table by the predetermined temperature conversion coefficient to acquire the temperature distribution information of the image display unit.

(33) The image display device according to (25) above, in which a value of an offset table for each area that stores, in the display area, an offset value representing an amount of heat generation of a heat source different from the image display unit, which corresponds to a position of the pixel area, is added to the value of the first heat distribution table to update the first heat distribution table, at every predetermined period.

(34) The image display device according to (33) above, in which the heat source different from the image display unit is a heat source arranged on a back surface of the pixel area.

(35) The image display device according to (33) above, in which the value of the first heat distribution table is multiplied by a predetermined temperature conversion coefficient to acquire the temperature distribution information of the image display unit.

(36) The image display device according to (35) above, in which a value of environmental temperature is added to the value obtained by multiplying the value of the first heat distribution table by the predetermined temperature conversion coefficient to acquire the temperature distribution information of the image display unit.

(37) An electronic apparatus, including
an image display device including
a device for estimating heat distribution of an image display unit that estimates heat distribution of an image display unit including a plurality of pixels arranged therein, the device for estimating heat distribution of an image display unit being configured
to calculate, based on image data, an average current value of a pixel area in a display surface, the pixel area including at least one pixel in an image display unit, the image display unit including a plurality of pixels arranged therein,
to calculate heat generation amount data by multiplying the calculated average current value by a predetermined current-heat conversion coefficient to convert the calculated average current value into a value corresponding to an amount of heat generation, and
to add the heat generation amount data to a value of a first heat distribution table to update the first heat distribution table, and creating a new first heat distribution table by performing a two-dimensional low pass filter process on the updated first heat distribution table before multiplying a value of the processed first heat distribution table by a predetermined heat dissipation coefficient, at every predetermined period.

(38) The electronic apparatus according to (37) above, in which a value of the first heat distribution table is multiplied by a predetermined temperature conversion coefficient to acquire temperature distribution information of the image display unit.

(39) The electronic apparatus according to (38) above, in which a value of environmental temperature is added to the value obtained by multiplying the value of the first heat distribution table by the predetermined temperature conversion coefficient to acquire the temperature distribution information of the image display unit.

(40) The electronic apparatus according to (37) above, in which a value of an offset table for each area that stores, corresponding to the display surface, an offset value representing an amount of heat generation of a heat source different from the image display unit, which corresponds to a position of the pixel area, is added to a second heat distribution table to update the second heat distribution table, and a new second heat distribution table is created by performing a two-dimensional low pass filter process on the updated second heat distribution table before multiplying a value of the processed second heat distribution table by a predetermined heat dissipation coefficient, at every predetermined period.

(41) The electronic apparatus according to (40) above, in which a value of the second heat distribution table is multiplied by a predetermined temperature conversion coefficient to acquire temperature distribution information of the image display unit related to the heat source different from the image display unit.

(42) The electronic apparatus according to (40) above, in which the heat source different from the image display unit is a heat source arranged on a back surface of the pixel area.

(43) The electronic apparatus according to (40) above, in which a value obtained by adding the value of the first heat distribution table to the value of the second heat distribution table is multiplied by a predetermined temperature conversion coefficient to acquire the temperature distribution information of the image display unit.

(44) The electronic apparatus according to (43) above, in which a value of environmental temperature is added to the value obtained by multiplying the value obtained by adding the first heat distribution table to the second heat distribution table by the predetermined temperature conversion coefficient to acquire the temperature distribution information of the image display unit.

(45) The electronic apparatus according to (37) above, in which a value of an offset table for each area that stores, in the display area, an offset value representing an amount of heat generation of a heat source different from the image display unit, which corresponds to a position of the pixel area, is added to the value of the first heat distribution table to update the first heat distribution table, at every predetermined period.

(46) The electronic apparatus according to (45) above, in which the heat source different from the image display unit is a heat source arranged on a back surface of the pixel area.

(47) The electronic apparatus according to (45) above, in which the value of the first heat distribution table is multiplied by a predetermined temperature conversion coefficient to acquire the temperature distribution information of the image display unit.

(48) The electronic apparatus according to (47) above, in which a value of environmental temperature is added to the value obtained by multiplying the value of the first heat distribution table by the predetermined temperature conversion coefficient to acquire the temperature distribution information of the image display unit.

(49) A program that causes a computer to execute the steps of:

calculating, based on image data, an average current value of a pixel area in a display surface, the pixel area including at least one pixel in an image display unit, the image display unit including a plurality of pixels arranged therein;

calculating heat generation amount data by multiplying the calculated average current value by a predetermined current-heat conversion coefficient to convert the calculated average current value into a value corresponding to an amount of heat generation; and adding the heat generation amount data to a value of a first heat distribution table to update the first heat distribution table, and creating a new first heat distribution table by performing a two-dimensional low pass filter process on the updated first heat distribution table before multiplying a value of the processed first heat distribution table by a predetermined heat dissipation coefficient, at every predetermined period.

(50) The program according to (49) above, in which a value of the first heat distribution table is multiplied by a predetermined temperature conversion coefficient to acquire temperature distribution information of the image display unit.

(51) The program to (50) above, in which a value of environmental temperature is added to the value obtained by multiplying the value of the first heat distribution table by the predetermined temperature conversion coefficient to acquire the temperature distribution information of the image display unit.

(52) The program according to (49) above, in which a value of an offset table for each area that stores, corresponding to the display surface, an offset value representing an amount of heat generation of a heat source different from the image display unit, which corresponds to a position of the pixel area, is added to a second heat distribution table to update the second heat distribution table, and a new second heat distribution table is created by performing a two-dimensional low pass filter process on the updated second heat distribution table before multiplying a value of the processed second heat distribution table by a predetermined heat dissipation coefficient, at every predetermined period.

(53) The program according to (52) above, in which a value of the second heat distribution table is multiplied by a predetermined temperature conversion coefficient to acquire temperature distribution information of the image display unit related to the heat source different from the image display unit.

(54) The program according to (52) above, in which the heat source different from the image display unit is a heat source arranged on a back surface of the pixel area.

(55) The program according to (52) above, in which a value obtained by adding the value of the first heat distribution table to the value of the second heat distribution table is multiplied by a predetermined temperature conversion coefficient to acquire the temperature distribution information of the image display unit.

(56) The program according to (55) above, in which a value of environmental temperature is added to the value obtained by multiplying the value obtained by adding the first heat distribution table to the second heat distribution table by the predetermined temperature conversion coefficient to acquire the temperature distribution information of the image display unit.

(57) The program according to (49) above, in which a value of an offset table for each area that stores, in the display area, an offset value representing an amount of heat generation of a heat source different from the image display unit, which corresponds to a position of the pixel area, is added to the value of the first heat distribution table to update the first heat distribution table, at every predetermined period.

(58) The method of estimating heat distribution of an image display unit according to (57) above, in which the heat source different from the image display unit is a heat source arranged on a back surface of the pixel area.

(59) The program according to (57) above, in which the value of the first heat distribution table is multiplied by a predetermined temperature conversion coefficient to acquire the temperature distribution information of the image display unit.

(60) The program according to (59) above, in which a value of environmental temperature is added to the value obtained by multiplying the value of the first heat distribution table by the predetermined temperature conversion coefficient to acquire the temperature distribution information of the image display unit.

It should be understood by those skilled in the art that various modifications, combinations, sub-combinations and alterations may occur depending on design requirements and other factors insofar as they are within the scope of the appended claims or the equivalents thereof.

What is claimed is:

1. A method comprising:

calculating, with a control circuit of an image display unit, an average electrical current value of a pixel area in a display surface based on image data, the pixel area including at least one pixel in the image display unit, the image display unit including a plurality of pixels arranged therein;

calculating, with the control circuit, heat generation amount data by multiplying the average electrical current value with a predetermined electrical current-heat conversion coefficient to convert the average electrical current value into a value corresponding to an amount of heat generation;

adding, with the control circuit, the heat generation amount data to a value of a first heat distribution table of the image display unit to update the first heat distribution table;

generating, with the control circuit, a new first heat distribution table of the image display unit by
processing the first heat distribution table that is updated with a two-dimensional low pass filter process, and
multiplying, at every predetermined period, a value of the first heat distribution table that is processed with a predetermined heat dissipation coefficient; and generating, with the control circuit, at least one of a corrected brightness signal or a corrected image signal based at least in part on the new first heat distribution table, wherein the at least one of the corrected brightness signal or the corrected image signal reduces a screen burn-in of the image display unit.

2. The method according to claim 1, further comprising:
acquiring temperature distribution information of the image display unit by multiplying a value of the first heat distribution table with a predetermined temperature conversion coefficient.

3. The method according to claim 2, wherein
acquiring the temperature distribution information of the image display unit further includes adding a value of environmental temperature to a value obtained by multiplying the value of the first heat distribution table with the predetermined temperature conversion coefficient.

4. The method according to claim 1, further comprising:
adding a value of an offset table for each area that stores, corresponding to the display surface, an offset value representing an amount of heat generation of a heat source different from the image display unit, which corresponds to a position of the pixel area, to a second heat distribution table to update the second heat distribution table; and generating a new second heat distribution table by
processing the second heat distribution table that is updated with a second two-dimensional low pass filter process, and
multiplying, at every predetermined period, a value of the second heat distribution table that is processed with a second predetermined heat dissipation coefficient.

5. The method according to claim 4, further comprising:
acquiring temperature distribution information of the image display unit related to the heat source different from the image display unit by multiplying a value of the second heat distribution table with a predetermined temperature conversion coefficient.

6. The method according to claim 4, wherein
the heat source different from the image display unit is arranged on a back surface of the pixel area.

7. The method according to claim 4, further comprising:
acquiring temperature distribution information of the image display unit by
adding the value of the first heat distribution table to the value of the second heat distribution table to obtain a combined value, and
multiplying the combined value with a predetermined temperature conversion coefficient to obtain a second combined value.

8. The method according to claim 7, wherein
acquiring the temperature distribution information further includes adding a value of environmental temperature to the second combined value.

9. The method according to claim 1, further comprising:
adding, at the every predetermined period, to the value of the first heat distribution table a value of an offset table for each area that stores an offset value representing an amount of heat generation of a heat source different from the image display unit, which corresponds to a position of the pixel area.

10. The method according to claim 9, wherein
the heat source different from the image display unit is arranged on a back surface of the pixel area.

11. The method according to claim 9, further comprising:
acquiring temperature distribution information of the image display unit by multiplying the value of the first heat distribution table with a predetermined temperature conversion coefficient.

12. The method according to claim 11, wherein
acquiring the temperature distribution information further includes adding a value of environmental temperature to a value obtained by the multiplying the value of the first heat distribution table with the predetermined temperature conversion coefficient.

13. A control circuit comprising:
memory configured to store a first heat distribution table of an image display unit; and
processing circuitry configured to
calculate an average electrical current value of a pixel area in a display surface based on image data, the pixel area including at least one pixel in the image display unit, the image display unit including a plurality of pixels arranged therein,
calculate heat generation amount data by multiplying the average electrical current value with a predetermined electrical current-heat conversion coefficient to convert the average electrical current value into a value corresponding to an amount of heat generation,
add the heat generation amount data to a value of the first heat distribution table stored in the memory to update the first heat distribution table,
generate a new first heat distribution table of the image display unit by
processing the first heat distribution table that is updated with a two-dimensional low pass filter process, and
multiplying, at every predetermined period, a value of the first heat distribution table that is processed with a predetermined heat dissipation coefficient and
generate at least one of a corrected brightness signal or a corrected image signal based at least in part on the new first heat distribution table, wherein the at least one of the corrected brightness signal or the corrected image signal reduces a screen burn-in of the image display unit.

14. An image display device comprising:
an image display unit including a plurality of pixels; and
a control circuit including
a memory configured to store a first heat distribution table of the image display unit, and
processing circuitry configured to
calculate an average electrical current value of a pixel area in a display surface based on image data, the pixel area including at least one pixel of the plurality of pixels of the image display unit, calculate heat generation amount data by multiplying the average electrical current value with a predetermined electrical current-heat conversion coefficient to convert the average electrical current value into a value corresponding to an amount of heat generation, add the heat generation amount data to a value of the first heat distribution table stored in the memory to update the first heat distribution table, generate a new first heat distribution table of the image display unit by processing the first heat distribution table that is updated with a two-dimensional low pass filter process, and multiplying, at every predetermined period, a value of the first heat distribution table that is processed with a predetermined heat dissipation coefficient, and generate at least one of a corrected brightness signal or a corrected image signal based at least in part on the new first heat distribution table, wherein the at least one of the corrected brightness signal or the corrected image signal reduces a screen burn-in of the image display unit.

15. An electronic apparatus comprising:
an image display device including
an image display unit including a plurality of pixels, and
a control circuit including
a memory configured to store a first heat distribution table of the image display unit, and
processing circuitry configured to
determine an average electrical current value of a pixel area in a display surface, the pixel area including at least one pixel of the plurality of pixels of the image display unit, calculate heat generation amount data by multiplying the average electrical current value with a predetermined electrical current-heat conversion coefficient to convert the average electrical current value into a value corresponding to an amount of heat generation, add the heat generation amount data to a value of the first heat distribution table stored in the memory to update the first heat distribution table, generate a new first heat distribution table by
processing the first heat distribution table that is updated with a two-dimensional low pass filter process, and multiplying, at every predetermined period, a value of the first heat distribution table that is processed with a predetermined heat dissipation coefficient, and generate at least one of a corrected brightness signal or a corrected image signal based at least in part on the new first heat distribution table, wherein the at least one of the corrected brightness signal or the corrected image signal reduces a screen burn-in of the image display unit.

16. A non-transitory computer-readable medium that, when executed by a computing device, causes the computing device to perform a set of operations, the set of operations comprising:

calculating an average electrical current value of a pixel area in a display surface based on image data, the pixel area including at least one pixel in an image display unit, the image display unit including a plurality of pixels arranged therein;

calculating heat generation amount data by multiplying the average electrical current value with a predetermined electrical current-heat conversion coefficient to convert the average electrical current value into a value corresponding to an amount of heat generation;

adding the heat generation amount data to a value of a first heat distribution table of the image display unit to update the first heat distribution table;

generating a new first heat distribution table of the image display unit by processing the first heat distribution table that is updated with a two-dimensional low pass filter process, and multiplying, at every predetermined period, a value of the first heat distribution table that is processed with a predetermined heat dissipation coefficient and generating at least one of a corrected brightness signal or a corrected image signal based at least in part on the new first heat distribution table, wherein the at least one of the corrected brightness signal or the corrected image signal reduces a screen burn-in of the image display unit.

17. The non-transitory computer-readable medium according to claim 16, wherein the set of operations further includes acquiring temperature distribution information of the image display unit by multiplying a value of the first heat distribution table with a predetermined temperature conversion coefficient.

18. The non-transitory computer-readable medium according to claim 17, wherein acquiring the temperature distribution information of the image display unit further includes adding a value of environmental temperature to a value obtained by multiplying the value of the first heat distribution table with the predetermined temperature conversion coefficient.

19. The non-transitory computer-readable medium according to claim 16, wherein the set of operations further includes adding a value of an offset table for each area that stores, corresponding to the display surface, an offset value representing an amount of heat generation of a heat source different from the image display unit, which corresponds to a position of the pixel area, to a second heat distribution table to update the second heat distribution table; and generating a new second heat distribution table by
processing the second heat distribution table that is updated with a second two-dimensional low pass filter process, and multiplying, at every predetermined period, a value of the second heat distribution table that is processed with a second predetermined heat dissipation coefficient.

20. The non-transitory computer-readable medium according to claim 19, wherein the set of operations further includes acquiring temperature distribution information of the image display unit related to the heat source different from the image display unit by multiplying a value of the second heat distribution table with a predetermined temperature conversion coefficient.

* * * * *